United States Patent
Kitagawa

(10) Patent No.: US 8,299,829 B2
(45) Date of Patent: Oct. 30, 2012

(54) CLOCK GENERATION CIRCUIT, SEMICONDUCTOR DEVICE INCLUDING THE SAME, AND METHOD OF GENERATING CLOCK SIGNAL

(75) Inventor: Katsuhiro Kitagawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 41 days.

(21) Appl. No.: 13/064,234

(22) Filed: Mar. 11, 2011

(65) Prior Publication Data

US 2011/0227619 A1    Sep. 22, 2011

(30) Foreign Application Priority Data

Mar. 19, 2010   (JP) ................... 2010-064483

(51) Int. Cl.
*H03L 7/06*    (2006.01)
*H03K 7/08*    (2006.01)
(52) U.S. Cl. ........ 327/158; 327/149; 327/151; 327/160; 327/175
(58) Field of Classification Search .................. 327/149, 327/151, 153, 158, 160, 161, 172–175
See application file for complete search history.

(56) References Cited

U.S. PATENT DOCUMENTS

| | | | |
|---|---|---|---|
| 7,142,027 B2 | 11/2006 | Lee et al. | |
| 7,184,509 B2 | 2/2007 | Cho et al. | |
| 7,358,784 B2 | 4/2008 | Kim et al. | |
| 7,719,921 B2 * | 5/2010 | Kuroki et al. | 365/233.1 |
| 7,755,401 B2 * | 7/2010 | Abe | 327/149 |
| 7,830,189 B2 * | 11/2010 | Abe | 327/158 |
| 7,876,138 B2 * | 1/2011 | Kobayashi et al. | 327/158 |
| 8,164,370 B2 * | 4/2012 | Miyano | 327/158 |
| 2011/0204942 A1 * | 8/2011 | Abe et al. | 327/158 |

FOREIGN PATENT DOCUMENTS

| | | |
|---|---|---|
| JP | 2004-129255 | 4/2004 |
| JP | 2005-218091 | 8/2005 |
| JP | 2007-097182 | 4/2007 |
| JP | 2008-311999 | 12/2008 |

* cited by examiner

*Primary Examiner* — Patrick O'Neill
(74) *Attorney, Agent, or Firm* — McGinn IP Law Group, PLLC

(57) ABSTRACT

To provide a DLL circuit incorporating a duty adjustment circuit that is independent of the frequency of a clock signal. The DLL circuit includes: a delay line that delays a first internal clock signal to generate a second internal clock signal; a counter circuit that specifies an amount of delay of the delay line; a counter control circuit that adjusts a count value of the counter circuit; and a subtraction circuit that determines a difference between first and second count values at which the rise edge of the first internal clock signal coincides with that of a replica clock signal. The fall edge of the second internal clock signal is adjusted based on a value equivalent to one-half of the difference obtained. This prevents the applicable frequency range from being limited as with a type of duty adjustment circuit that alternately discharges capacitors.

11 Claims, 6 Drawing Sheets

CLOCK GENERATION CIRCUIT, SEMICONDUCTOR DEVICE INCLUDING THE SAME, AND METHOD OF GENERATING CLOCK SIGNAL

BACKGROUND OF THE INVENTION

1. Field of the Invention

The present invention relates to a clock generation circuit and a semiconductor device including the same, and more particularly to a clock generation circuit having a duty adjustment circuit and a semiconductor device including the same. The present invention also relates to a method of generating a clock signal, and more particularly to a method of generating a clock signal with a duty adjustment.

2. Description of Related Art

In recent years, synchronous memories which operate in synchronization with a clock signal have been widely used for main memories of personal computers and the like. DDR (Double Data Rate) synchronous memories absolutely need a DLL circuit for generating an internal clock signal synchronous with an external clock signal since the input and output data needs to be exactly synchronized with the external clock signal.

The DLL circuit generates the internal clock signal by delaying the external clock signal. The amount of delay is determined by comparing the phase of the rise edge of the external clock signal with that of the rise edge of the internal clock signal (replica clock signal) which has the same phase as that of read data. Specifically, if the rise edge of the internal clock signal lags behind the rise edge of the external clock signal in phase, the DLL circuit decreases the amount of delay for phase matching. On the other hand, if the rise edge of the internal clock signal leads the rise edge of the external clock signal in phase, the DLL circuit increases the amount of delay for phase matching.

The internal clock signal desirably has a duty of 50%. The fall edge of the internal clock signal is thus typically adjusted by using a duty adjustment circuit (DCC). A typical duty adjustment circuit alternately discharges two capacitors by using in-phase and reversed phase signals of the internal clock signal, and compares the potentials of the discharged capacitors to determine the duty. If the duty is determined to be above 50%, the fall edge of the internal clock signal is advanced to decrease the duty. If the duty is determined to be below 50%, the fall edge of the internal clock signal is delayed to increase the duty.

The foregoing duty adjustment circuit has had the problem that it is only applicable to a narrow frequency range since the amounts of discharge vary largely depending on the frequency of the internal clock signal. Specifically, if the internal clock signal is low in frequency (the internal clock signal has long cycles), the amounts of discharge can be so large that the capacitor potentials are saturated to make the duty detection not possible. On the other hand, if the internal clock signal is high in frequency (the internal clock signal has short cycles), the amounts of discharge can be so small that the resulting potential difference shrinks to cause a misjudgment.

Such a problem can be solved, for example, by a DLL circuit that is described in Japanese Patent Application Laid-Open No. 2005-218091. The DLL circuit described in Japanese Patent Application Laid-Open No. 2005-218091 is a type of DLL circuit that uses oscillators to adjust the positions of the rise and fall edges of the internal clock signal. Since there is no need to discharge capacitors as in the foregoing duty adjustment circuit, the foregoing problem can be solved. Unlike typical DLL circuits, a delay line for delaying the external clock signal is also unnecessary.

Other known examples of the circuit for generating an internal clock signal include the circuits described in Japanese Patent Application Laid-Open Nos. 2004-129255, 2007-097182, and 2008-311999.

However, the DLL circuit described in Japanese Patent Application Laid-Open No. 2005-218091 needs a plurality of oscillators, and thus has had the problem that the oscillators can serve as noise sources. There has been another problem that no use of a delay line, unlike typical DLL circuits, precludes simple application of the DLL circuit technologies that have been accumulated so far. Under the circumstances, it is desired for a typical DLL circuit using a delay line to implement an improved duty adjustment circuit that is independent of the clock signal frequency.

SUMMARY

In one embodiment, there is provided a clock generation circuit that includes: a delay line that delays a first clock signal to generate a second clock signal; a counter circuit that specifies an amount of delay of the delay line; a counter control circuit that adjusts a count value of the counter circuit so that first active edges of the first and second clock signals have a predetermined relationship; and a duty adjustment circuit that adjusts a second active edge of the second clock signal based on first and second count values at each of which the first active edges of the first and second clock signals have the predetermined relationship.

In one embodiment, there is provided a semiconductor device that includes: the foregoing clock generation circuit; an output buffer that outputs output data to outside in synchronization with the second clock signal; and a replica buffer that is a replica of the output buffer and generates a third clock signal in synchronization with the second clock signal. The counter control circuit updates the count value of the counter circuit so that a first active edge of the third clock signal coincides with the first active edge of the first clock signal. The first and second count values both are count values where the first active edges of the first and third clock signals coincide with each other.

In one embodiment, there is provided a method of generating a clock signal by using a clock generation circuit that includes a delay line and a counter circuit, the delay line delaying a first clock signal to generate a second clock signal, the counter circuit specifying an amount of delay of the delay line that includes: acquiring a first count value by adjusting a count value of the counter circuit so that first active edges of the first and second clock signals have a predetermined relationship; acquiring a second count value different from the first count value by adjusting the count value of the counter circuit so that the first active edges of the first and second clock signals have the predetermined relationship; performing an arithmetic operation using the first and second count values to generate a third count value; and adjusting a second active edge of the second clock signal based on the third count value.

According to the present invention, a plurality of count values that indicate the adjusted positions of the first active edges (for example, rise edges) are acquired, and the position of the second active edge (for example, fall edge) is adjusted based on the count values. This prevents the applicable frequency range from being limited as with a type of duty adjustment circuit that alternately discharges capacitors. The use of the delay line as in typical DLL circuits needs only a modification to a previously-designed DLL circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENT

Preferred embodiments of the present invention will be explained below in detail with reference to the accompanying drawings.

Figure 1:
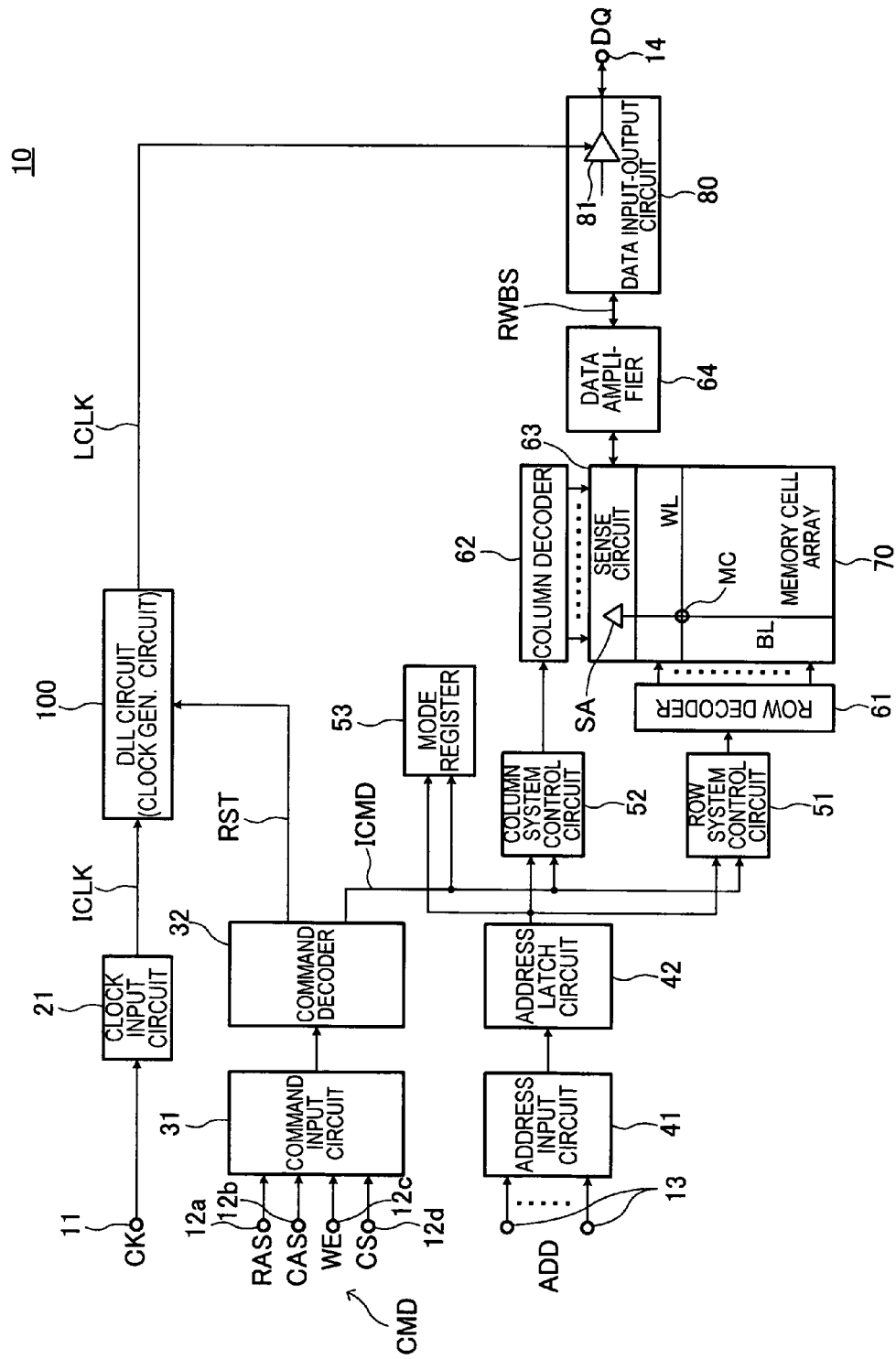
FIG. 1 is a block diagram showing a configuration of a semiconductor device 10 according to a preferred embodiment of the present invention.

FIG. 1 is a block diagram showing the configuration of a semiconductor device 10 according to a preferred embodiment of the present invention.

The semiconductor device 10 according to the present embodiment is a synchronous DRAM (Dynamic Random Access Memory) which is integrated on a single semiconductor chip. The semiconductor device 10 has external terminals including a clock terminal 11, command terminals 12a to 12d, address terminals 13, and a data input-output terminal 14. The semiconductor device 10 also has other terminals such as a data strobe terminal and a power supply terminal, which are omitted from the diagram.

The clock terminal 11 is a terminal to which an external clock signal CK is supplied. The external clock signal CK supplied is supplied to a clock input circuit 21. Receiving the external clock signal CK, the clock input circuit 21 generates an internal clock signal ICLK (first clock signal), and supplies the internal clock signal ICLK to a DLL circuit 100. The DLL circuit 100 functions to generate a phase- and duty-controlled internal clock signal LCLK (second clock signal) based on the internal clock signal ICLK and supply the internal clock signal LCLK to a data input-output circuit 80. The circuit configuration of the DLL circuit 100 will be described later.

The command terminals 12a to 12d are terminals to which command signals CMD such as a row address strobe signal RAS, a column address strobe signal CAS, a write enable signal WE, and a chip select signal CS are supplied, respectively. The command signals CMD are supplied to a command input circuit 31. The command signals CMD supplied to the command input circuit 31 are supplied to a command decoder 32. The command decoder 32 is a circuit that holds, decodes, counts, or otherwise processes the command signals to generate various internal commands ICMD. The internal commands ICMD generated are supplied to a row system control circuit 51, a column system control circuit 52, and a mode register 53. A DLL reset signal RST, one of the internal commands ICMD, is supplied to the DLL circuit 100. The DLL reset signal RST is activated upon power-on, when returning from a self refresh mode, and on other occasions.

The address terminals 13 are terminals to which address signals ADD are supplied. The address signals ADD supplied are supplied to an address input circuit 41. The output of the address input circuit 41 is supplied to an address latch circuit 42. Among the address signals ADD latched in the address latch circuit 42, a row address is supplied to the row system control circuit 51 and a column address is supplied to the column system control circuit 52. When entering in a mode-register setting mode based on the command signals CMD, the address signals ADD are supplied to the mode register 53, whereby the content of the mode register 53 is updated. The mode register 53 is a register in which operation parameters of the semiconductor device 10 (burst length, CAS latency, etc.) are set.

The output of the row system control circuit 51 is supplied to a row decoder 61. The row decoder 61 is a circuit that selects any one of word lines WL included in a memory cell array 70. The memory cell array 70 includes a plurality of word lines WL and a plurality of bit lines BL which cross each other, and memory cells MC are arranged on the intersections (FIG. 1 shows only one of the word lines WL, one of the bit lines BL, and one of the memory cells MC). The bit lines BL are connected to corresponding sense amplifiers SA in a sense circuit 63.

The output of the column system control circuit 52 is supplied to a column decoder 62. The column decoder 62 is a circuit that selects any one of the sense amplifiers SA included in the sense circuit 63. The sense amplifier SA selected by the column decoder 62 is connected to a data amplifier 64. In a read operation, the data amplifier 64 further amplifies read data that is amplified by the sense amplifier SA, and supplies the resultant to the data input-output circuit 80 through a read/write bus RWBS. In a write operation, the data amplifier 64 amplifies write data that is supplied from the data input-output circuit 80 through the read/write bus RWBS, and supplies the resultant to the sense amplifiers SA.

The data input-output terminal 14 is a terminal for outputting read data DQ and inputting write data DQ, and is connected to the data input-output circuit 80. The data input-output circuit 80 includes an output buffer 81. In a read operation, the output buffer 81 outputs the read data in synchronization with the internal clock LCLK.

Figure 2:
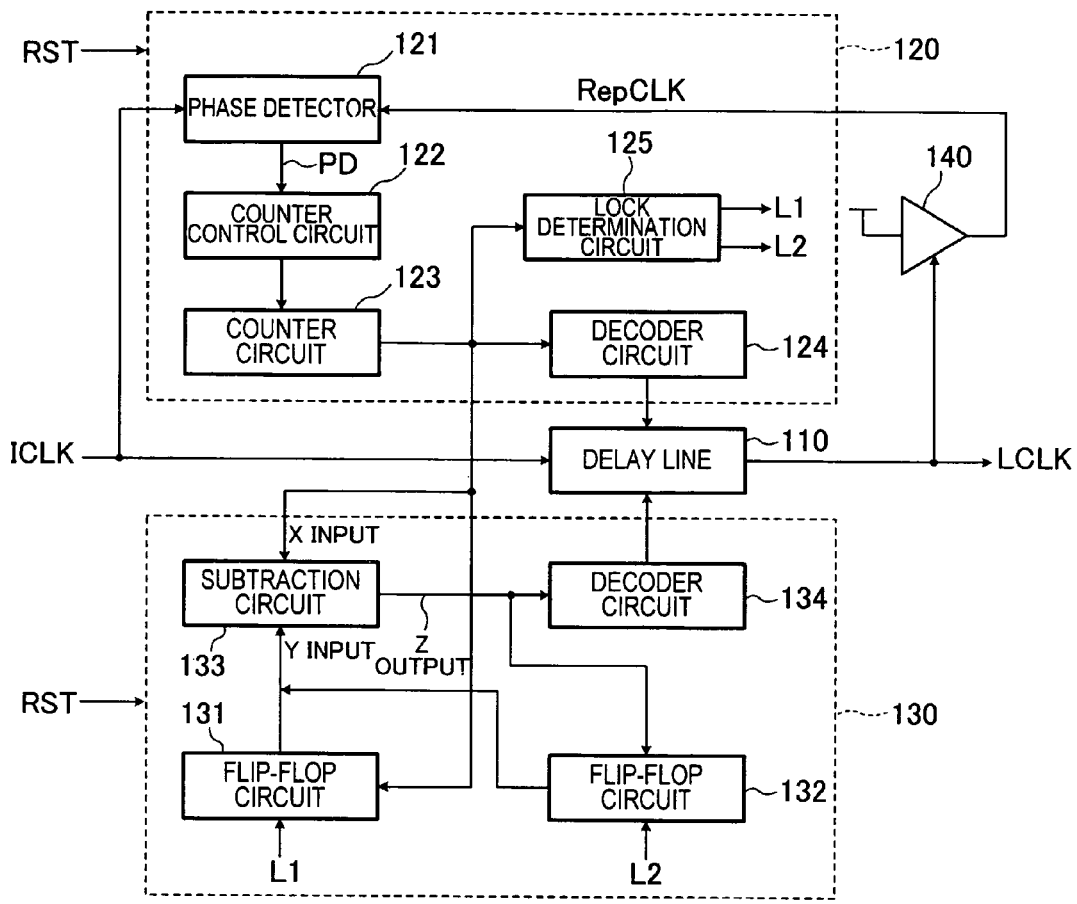
FIG. 2 is a block diagram showing a configuration of the DLL circuit 100.

FIG. 2 is a block diagram showing the configuration of the DLL circuit 100.

As shown in FIG. 2, the DLL circuit 100 includes a delay line 110, a rise edge generating unit 120, a fall edge generating unit 130, and a replica buffer 140. Here, the fall edge generating unit 130 is the circuit that corresponds to the duty adjustment circuit.

The delay line 110 is a circuit that delays the internal clock ICLK (first clock signal) to generate the internal clock signal LCLK (second clock signal). Although not limited in particular, the delay line 110 preferably includes a coarse delay line that delays an external clock signal at relatively coarse adjustment pitches and a fine delay line that delays the external clock signal at relatively fine adjustment pitches. The rise edge (first active edge) of the internal clock signal LCLK generated by the delay line 110 is adjusted by the rise edge generating unit 120. The fall edge (second active edge) is adjusted by the fall edge generating unit 130.

The internal clock signal LCLK is supplied to the data input-output circuit 80 shown in FIG. 1 as well as to the replica buffer 140 as shown in FIG. 2. The replica buffer 140 is a replica circuit of the output buffer 81 included in the data input-output circuit 80. The replica buffer 140 receives the internal clock signal LCLK and generates a replica clock signal RepCLK (third clock signal). The replica clock signal RepCLK is supplied to the rise edge generating unit 120, but not to the fall edge generating unit 130. The reason is that according to the present invention, the replica clock signal RepCLK will not be used directly to adjust the fall edge.

The rise edge generating unit 120 includes a phase detector 121, a counter control circuit 122, a counter circuit 123, a decoder circuit 124, and a lock determination circuit 125.

The phase detector 121 is a circuit that detects the phase of the rise edge of the internal clock signal ICLK and that of the rise edge of the replica clock signal RepCLK. The phase of the replica clock signal RepCLK is adjusted by the delay line 110 so as to coincide with that of the read data DQ. Both the clock signals change in phase from moment to moment due to factors such as variations in parameters that can affect the amount of delay of the delay line 110, like voltage and temperature, and variations in the frequency of the external clock signal CK itself. The phase detector 121 detects such changes, and determines whether the replica clock signal RepCLK leads or lags behind the internal clock signal ICLK. Although not limited in particular, the determination is made in each cycle of the internal clock signal ICLK, and the result is supplied to the counter control circuit 122 as a phase determination signal PD.

The counter control circuit 122 is a circuit that updates the count value of the counter circuit 123. The counter circuit 123 is a circuit that specifies the amount of delay of the delay line 110. Whether to increase or decrease the count value of the counter circuit 123 is determined based on the phase determination signal PD which is supplied from the phase detector 121. Specifically, if the phase determination signal PD indicates that the replica clock signal RepCLK leads the internal clock signal ICLK in phase, the counter control circuit 122 counts up the count value so that the amount of delay of the delay line 110 increases. On the other hand, if the phase determination signal PD indicates that the replica clock signal RepCLK lags behind the internal clock signal ICLK in phase, the counter control circuit 122 counts down the count value so that the amount of delay of the delay line 110 decreases. Although not limited in particular, the count value is updated at every several cycles (for example, 16 cycles) of the internal clock signal ICLK.

The count value of the counter circuit 123 is supplied to the decoder circuit 124. The decoder circuit 124 decodes the count value of the counter circuit 123 and supplies the decoding result to the delay line 110. This gives the delay line 110 the amount of delay of the rise edge corresponding to the count value of the counter circuit 123. That is, the relationship between the rise edge of the internal clock signal ICLK and the rise edge of the internal clock signal LCLK is determined by the count value of the counter circuit 123. The count value of the counter circuit 123 is also supplied to the lock determination circuit 125.

The lock determination circuit 125 is a circuit that determines whether the DLL circuit 100 is in a locked state. The locked state refers to a state where the rise edge of the internal clock signal ICLK and the rise edge of the replica clock signal RepCLK almost coincide with each other. Since the phase detector 121 always makes either one of the determinations that the phase is leading or lagging, the count value of the counter circuit 123 repeats being alternately counted up and down if the DLL circuit 100 is in the locked state. The lock determination circuit 125 detects such changes in the count value, and if the DLL circuit 110 is determined to be in the locked state, activates lock determination signals L1 and L2. The lock determination signal L1 is a signal that is activated when the locked state is detected for the first time. The lock determination signal L2 is a signal that is activated when the locked state is detected for the second time.

The count value of the counter circuit 123 is also supplied to the fall edge generating unit 130. The fall edge generating unit 130 includes flip-flop circuits 131 and 132, a subtraction circuit 133, and a decoder circuit 134.

The flip-flop circuit 131 is a circuit that latches the count value of the counter circuit 123 in response to the lock determination signal L1. The count value latched in the flip-flop circuit 131 is supplied to the subtraction circuit 133.

Figure 3:
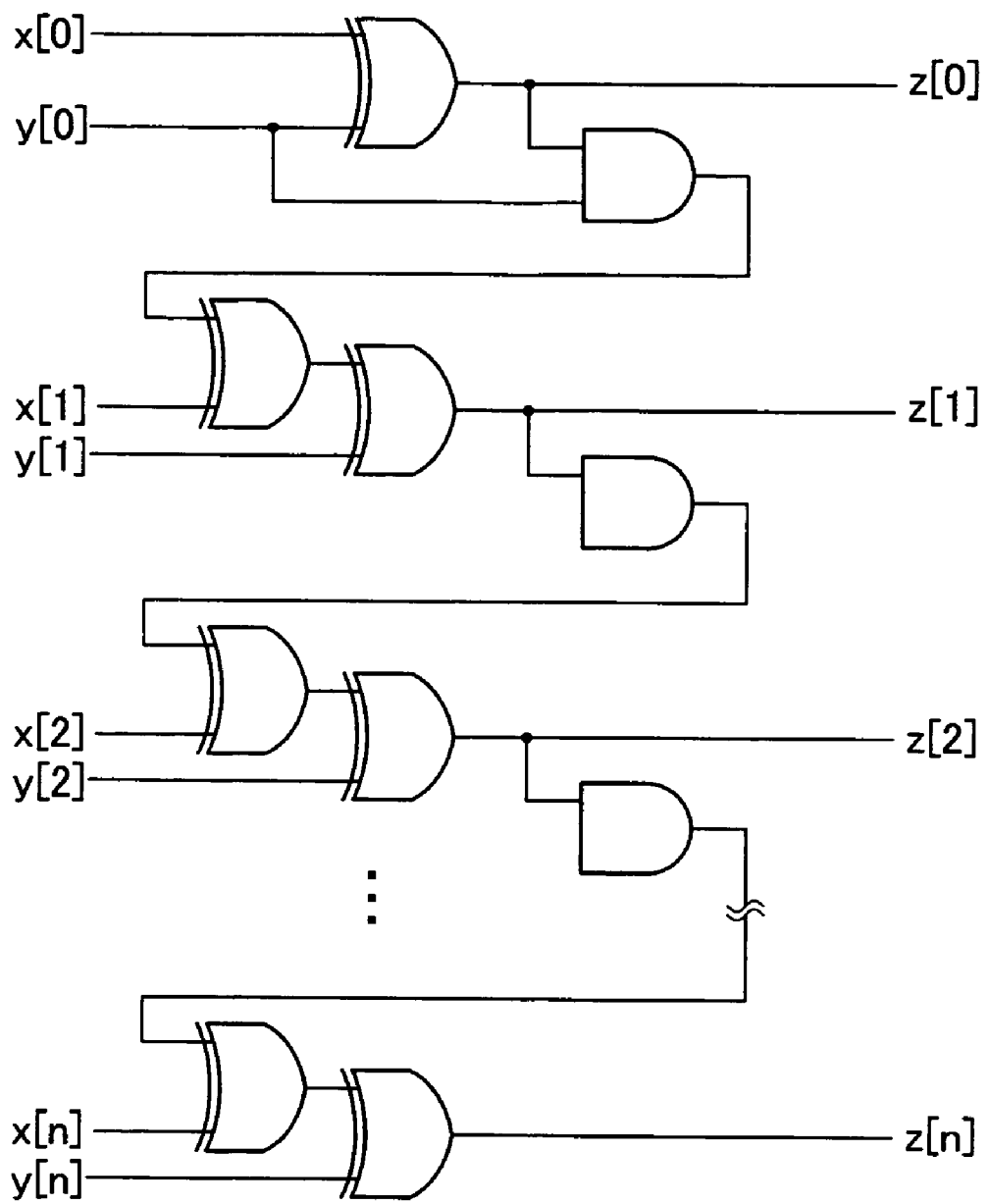
FIG. 3 is a circuit diagram of a subtraction circuit 133.

The subtraction circuit 133 is a circuit that determines a difference between an X input value and a Y input value shown in FIG. 2. The X input value refers to the count value of the counter circuit 123. The Y input value refers to the value that is latched in the flip-flop circuit 131 or 132. The operation result is supplied to the decoder circuit 134 as a Z output value. FIG. 3 is a diagram showing a specific circuit example of the subtraction circuit 133. In the circuit example shown in FIG. 3, exclusive OR gates XOR and logical product gates AND are combined to perform the operation of X−Y with n+1 bits of X input value and Y input value, which produces n+1 bits of Z output value.

The decoder circuit 134 decodes the Z output value and supplies the decoding result to the delay line 110. This gives the delay line 110 the amount of delay of the fall edge corresponding to the X input value, which is the count value of the counter circuit 123, and the Y input value. That is, the relationship between the fall edge of the internal clock signal ICLK and the fall edge of the internal clock signal LCLK is determined by the Z output value.

The flip-flop circuit 132 is a circuit that latches part of the Z output value, which is the output of the subtraction circuit 133, in response to the lock determination signal L2 and outputs a value corresponding to one-half of the Z output value. The output of the flip-flop circuit 132 is used as the Y input value to the subtraction circuit 133.

Figure 4:
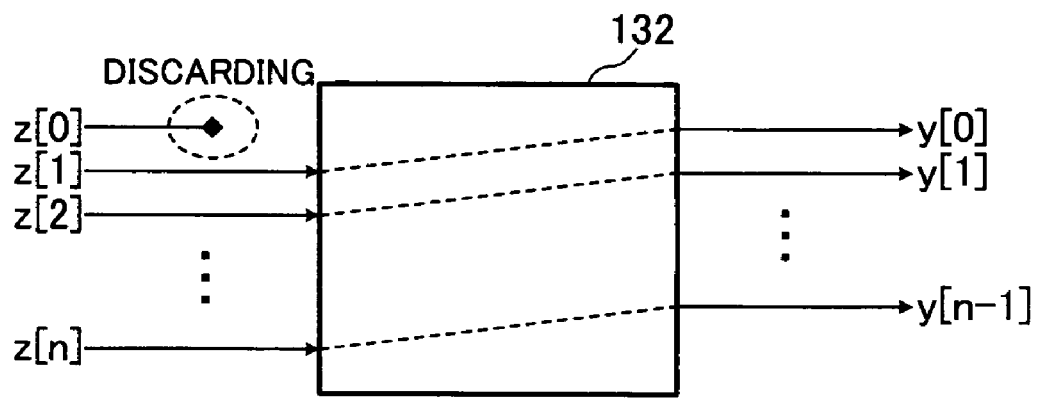
FIG. 4 is a schematic diagram for explaining a function of a flip-flop circuit 132.

FIG. 4 is a schematic diagram for explaining the function of the flip-flop circuit 132. As shown in FIG. 4, the flip-flop circuit 132 discards the least significant bit z[0] of the n+1 bits of Z output value, and shifts the upper bits z[n] to z[1] by one bit each and outputs the resultant as y[n−1] to y[0]. This provides the operation of Y=Z/2.

The configuration of the semiconductor device 10 according to the present embodiment has been described so far. Next, the operation of the semiconductor device 10 according to the present embodiment will be described.

Figure 5:
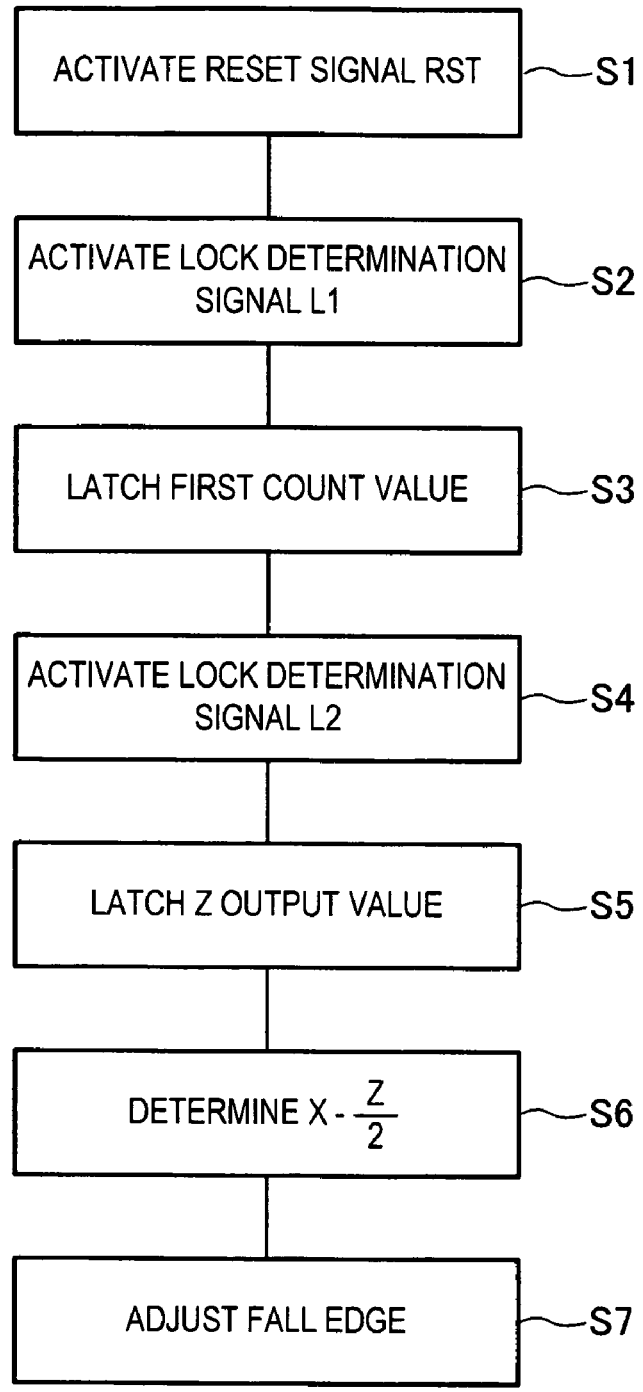
FIG. 5 is a flowchart for explaining an operation of the semiconductor device 10.

FIG. 5 is a flowchart for explaining the operation of the semiconductor device 10 according to the present embodiment.

As shown in FIG. 5, the DLL reset signal RST is activated upon power-on or in response to a return from a self refresh mode (step S1), whereby each of the circuit blocks that constitute the DLL circuit 100 is reset. For example, the count value of the counter circuit 123 is reset to an initial value. The initial value of the counter circuit 123 is not limited in particular, but is preferably an intermediate value (an intermediate value between maximum and minimum values).

After the resetting of the DLL circuit 100, the counter control circuit 122 updates the count value of the counter circuit 123 based on the phase determination signal PD which is supplied from the phase detector 121. As a result, the phase difference between the rise edge of the internal clock signal ICLK and the rise edge of the replica clock signal RepCLK decreases gradually. When the phase difference falls below a minimum resolution of the rise edge generating unit 120, the lock determination circuit 125 detects the locked state and activates the lock determination signal L1 in response (step S2).

Figure 6:
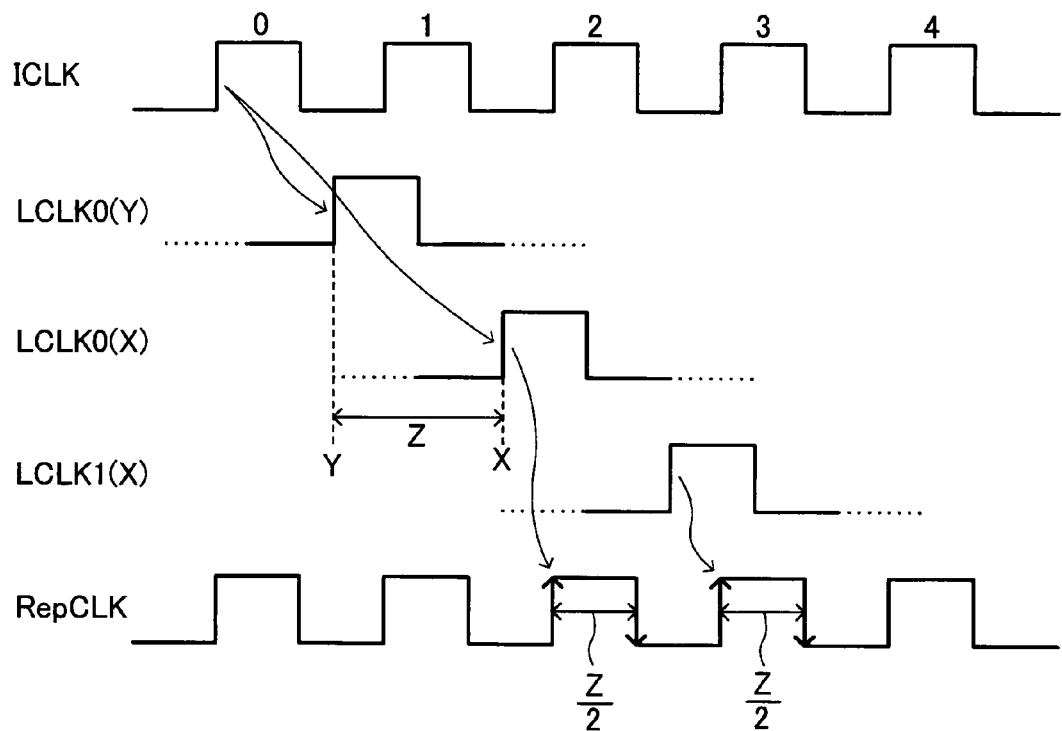
FIG. 6 is a timing chart for explaining the operation of the semiconductor device 10.

When the lock determination signal L1 is activated, the current count value (first count value) of the counter circuit 123 is latched into the flip-flop circuit 131 (step S3). As shown in FIG. 6, the internal clock signal LCLK at the point in time when the lock determination signal L1 is activated lags behind the internal clock signal ICLK by a predetermined amount. In FIG. 6, LCLK0(Y) denotes the extracted pulsed waveform of the internal clock signal LCLK that corresponds to pulse 0 of the internal clock signal ICLK at the point in time when the lock determination signal L1 is activated.

Next, the counter control circuit 122 further updates the count value of the counter circuit 123 based on the phase determination signal PD so that a locked state is achieved with a value different from the first count value that is latched in the flip-flop circuit 131. When the phase difference between the rise edge of the internal clock signal ICLK and the rise edge of the replica clock signal RepCLK falls below the minimum resolution of the rise edge generating unit 120 again, the lock determination circuit 125 detects the locked state and activates the lock determination signal L2 in response (step S4).

As shown in FIG. 6, the internal clock signal LCLK at the point in time when the lock determination signal L2 is activated lags behind the internal clock signal ICLK by a predetermined amount. In FIG. 6, LCLK0(X) denotes the extracted pulsed waveform of the internal clock signal LCLK that corresponds to pulse 0 of the internal clock signal ICLK at the point in time when the lock determination signal L2 is activated. As shown in FIG. 6, the waveform LCLK0($x$) lags behind the waveform. LCLK0(Y) by exactly one clock cycle. LCLK1(X) denotes the extracted pulsed waveform of the internal clock signal LCLK that corresponds to pulse 1 of the internal clock signal ICLK at the point in time when the lock determination signal L2 is activated.

When the lock determination signal L2 is activated, the Z output value from the subtraction circuit 133 is latched (in part) into the flip-flop circuit 132 (step S5). The Z output value shows the value of X−Y determined by the subtraction circuit 133. Here, the X input value is the current count value (second count value) of the counter circuit 123. The Y input value is the count value (first count value) that is latched in the flip-flop circuit 131. Consequently, the Z output value corresponds to one clock cycle of the internal clock signal ICLK.

As mentioned previously, the flip-flop circuit 132 latches part of the Z output value and outputs a value equivalent to Z/2. The value equivalent to Z/2, output from the flip-flop circuit 132, is input to the subtraction circuit 133 as the Y input value.

Consequently, the subtraction circuit 133 performs the operation of X−Z/2 (step S6). More specifically, the Z output value (third count value) input to the decoder circuit 134 has a value that is shifted exactly ½ clock cycle from the second count value of the counter circuit 123 (a value equivalent to half the cycle of the internal clock signal ICLK). The value defines the fall edge of the internal clock signal LCLK (step S7). It should be appreciated that the rise edge of the internal clock signal LCLK is adjusted based on the second count value by maintaining the immediately preceding locked state. However, the rise edge may be adjusted based on the first count value (the count value that is activated by the lock determination signal L1).

By the foregoing operation, the rise edge of the replica clock signal RepCLK is in exact synchronization with the rise edge of the internal clock signal ICLK as shown in FIG. 6, and the fall edge is controlled in position so that the duty is exactly 50%. That is, in the example shown in FIG. 6, the rise edges of the replica clock signal RepCLK corresponding to the waveforms LCLK0(X) and LCLK1(X) coincide with the rise edges of pulses 2 and 3 of the internal clock signal ICLK. The fall edges are positioned exactly ½ clock cycle behind the immediately previous rise edges.

As seen above, according to the semiconductor device 10 of the present embodiment, it is possible to adjust the duty of the internal clock signal LCLK to exact 50% without using a type of duty adjustment circuit that alternately discharges capacitors. The use of the delay line 110 facilitates actual designing since it is only needed to improve a previously-designed DLL circuit. There is even no need for oscillator circuits and the like that are prone to be a noise source.

It is apparent that the present invention is not limited to the above embodiments, but may be modified and changed without departing from the scope and spirit of the invention.

For example, the foregoing embodiment has dealt with the case where a plurality of locked states are created based on rise edges, and the positions of fall edges are adjusted based on the corresponding count values. Such an operation may be reversed, however. That is, a plurality of locked states may be created based on fall edges, and the positions of rise edges may be adjusted based on the corresponding count values.

The foregoing embodiment has also dealt with the case where the value of X−Y, the difference between the first count value (Y input value) and the second count value (X input value), is equivalent to one clock cycle. However, the value of X−Y may be any number of clock cycles as long as it is a natural number multiple of clock cycles. For example, if the value of X−Y is equivalent to two clock cycles, the value of (X−Y)/4 may be used to define the position of the fall edge.

The foregoing embodiment has also'dealt with the case where the position of the fall edge is adjusted based on a difference between X input value as the second count value and Y input value (=Z/2) as the third count value. However, the position of the fall edge may be adjusted based on the sum of the input values.

What is claimed is:

1. A clock generation circuit comprising:
   a delay line that delays a first clock signal to generate a second clock signal;
   a counter circuit that specifies an amount of delay of the delay line based on a count value thereof;
   a counter control circuit that adjusts the count value of the counter circuit so that first active edges of the first and second clock signals have a predetermined relationship; and
   a duty adjustment circuit that adjusts a second active edge of the second clock signal based on first and second count values at each of which the first active edges of the first and second clock signals have the predetermined relationship.

2. The clock generation circuit as claimed in claim 1, wherein
   a difference between the first count value and the second count value is equivalent to a natural number multiple of a cycle of the first clock signal,
   the duty adjustment circuit performs an arithmetic operation using the difference to generate a third count value equivalent to half the cycle of the first clock signal, and
   the duty adjustment circuit adjusts the second active edge of the second clock signal based on the third count value.

3. The clock generation circuit as claimed in claim 2, wherein the duty adjustment circuit adjusts the second active edge of the second clock signal based on a sum of or a difference between the first or second count value and the third count value.

4. The clock generation circuit as claimed in claim 1, wherein,
the counter control circuit updates the count value of the counter circuit so that a first active edge of a third clock signal generated based on the second clock signal coincides with the first active edge of the first clock signal, and
the first and second count values both are count values where the first active edges of the first and third clock signals coincide with each other.

5. A semiconductor device having a clock generation circuit, the clock generation circuit comprising:
a delay line that delays a first clock signal to generate a second clock signal;
a counter circuit that specifies an amount of delay of the delay line based on a count value thereof;
a counter control circuit that adjusts the count value of the counter circuit so that first active edges of the first and second clock signals have a predetermined relationship; and
a duty adjustment circuit that adjusts a second active edge of the second clock signal based on first and second count values at each of which the first active edges of the first and second clock signals have the predetermined relationship.

6. The semiconductor device as claimed in claim 5, wherein
a difference between the first count value and the second count value is equivalent to a natural number multiple of a cycle of the first clock signal,
the duty adjustment circuit performs an arithmetic operation using the difference to generate a third count value equivalent to half the cycle of the first clock signal, and
the duty adjustment circuit adjusts the second active edge of the second clock signal based on the third count value.

7. The semiconductor device as claimed in claim 6, wherein the duty adjustment circuit adjusts the second active edge of the second clock signal based on a sum of or a difference between the first or second count value and the third count value.

8. The semiconductor device as claimed in claim 5, wherein,
the counter control circuit updates the count value of the counter circuit so that a first active edge of a third clock signal generated based on the second clock signal coincides with the first active edge of the first clock signal, and
the first and second count values both are count values where the first active edges of the first and third clock signals coincide with each other.

9. A semiconductor device comprising:
a clock generation circuit;
an output buffer that outputs output data to outside in synchronization with a second clock signal; and
a replica buffer that is a replica of the output buffer and generates a third clock signal in synchronization with the second clock signal, wherein
the clock generation circuit comprises:
a delay line that delays a first clock signal to generate the second clock signal;
a counter circuit that specifies an amount of delay of the delay line based on a count value thereof;
a counter control circuit that adjusts the count value of the counter circuit so that first active edges of the first and second clock signals have a predetermined relationship; and
a duty adjustment circuit that adjusts a second active edge of the second clock signal based on first and second count values at each of which the first active edges of the first and second clock signals have the predetermined relationship, and wherein
the counter control circuit updates the count value of the counter circuit so that a first active edge of the third clock signal coincides with the first active edge of the first clock signal, and
the first and second count values both are count values where the first active edges of the first and third clock signals coincide with each other.

10. A method of generating a clock signal comprising:
providing a clock generation circuit that includes a delay line and a counter circuit, the delay line delaying a first clock signal to generate a second clock signal, the counter circuit specifying an amount of delay of the delay line based on a count value thereof;
acquiring a first count value by adjusting the count value of the counter circuit so that first active edges of the first and second clock signals have a predetermined relationship;
acquiring a second count value different from the first count value by adjusting the count value of the counter circuit so that the first active edges of the first and second clock signals have the predetermined relationship;
performing an arithmetic operation using the first and second count values to generate a third count value; and
adjusting a second active edge of the second clock signal based on the third count value.

11. The method of generating a clock signal as claimed in claim 10, further comprising adjusting the first active edge of the second clock signal based on the first or second count value.

* * * * *